US009294000B1

(12) United States Patent
Shook

(10) Patent No.: US 9,294,000 B1
(45) Date of Patent: Mar. 22, 2016

(54) DIRECT CONVERSION OUTPUT DRIVER

(71) Applicant: Texas Instruments Incorporated, Dallas, TX (US)

(72) Inventor: Adam Lee Shook, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/484,892

(22) Filed: Sep. 12, 2014

(51) Int. Cl.
*H02M 3/337* (2006.01)
*H02M 3/335* (2006.01)

(52) U.S. Cl.
CPC ........ *H02M 3/3372* (2013.01); *H02M 3/33569* (2013.01)

(58) Field of Classification Search
CPC .......... H02M 3/3372; H02M 3/33569; H02M 3/3376; H02M 3/1582; H02M 7/003; H02M 7/48; H02M 7/483; H02M 7/49; H01L 24/89; H01L 24/92; H01L 25/07; H01L 25/165; H01L 27/0629
USPC .......... 327/108, 110, 111, 112; 323/217, 218, 323/219; 363/132
See application file for complete search history.

(56) References Cited

U.S. PATENT DOCUMENTS

| 5,422,597 | A | * | 6/1995 | Stengel | ................. | H03F 3/2173 330/10 |
| 5,811,965 | A | * | 9/1998 | Gu | .......................... | G01R 15/18 324/117 R |
| 2011/0103117 | A1 | * | 5/2011 | Yoneda | ................... | H02M 7/48 363/132 |
| 2012/0127769 | A1 | * | 5/2012 | Kern | ................. | H02M 7/53871 363/132 |
| 2014/0016370 | A1 | * | 1/2014 | Chandrasekaran | ....... | H01F 3/14 363/21.12 |

* cited by examiner

*Primary Examiner* — John Poos
(74) *Attorney, Agent, or Firm* — Gregory J. Albin; Frank D. Cimino

(57) ABSTRACT

A circuit and method for providing a fully integrated differential boost converter and amplifier. A first half bridge circuit has a first output node and a first switching node. A second half bridge circuit has a second output node and a second switching node. A capacitive load is coupled between the first output node and the second output node. An inductor is coupled between the first switching node and the second switching node. Control modes are provided to couple the first output node to a supply voltage and the first switching node to ground; to couple the first output node to the supply voltage and the second switching node to ground; to couple the second output node to the supply voltage and the first switching node to ground; and to couple the second output node to the supply voltage and the second switching node to ground.

17 Claims, 4 Drawing Sheets

DIRECT CONVERSION OUTPUT DRIVER

TECHNICAL FIELD

This disclosure relates in general to electronic circuits, and in particular to a circuit and method for direct conversion of an input voltage to a stepped up output voltage.

BACKGROUND

A boost converter or step-up converter is a DC-DC power converter that generates an output voltage that is greater in magnitude than the input voltage. In a typical application, the boost converter is one portion of a circuit solution that generates a high voltage supply, which is then used to drive an amplifier. However, such a solution requires two inductors— one for the boost converter to charge and discharge, and one for the amplifier to block the switching frequency from the capacitive load.

Further, for a capacitive load, such a piezo ceramic speaker, the load can be driven with a continuous time varying signal, such as an audio signal.

Thus, it would be desirable to provide a boost converter for capacitive loads that has a compact design that does not require two inductors, while still providing acceptable fidelity and high efficacy.

DETAILED DESCRIPTION

This disclosure describes a circuit and method for providing fully integrated differential boost converter and amplifier.

Figure 1:
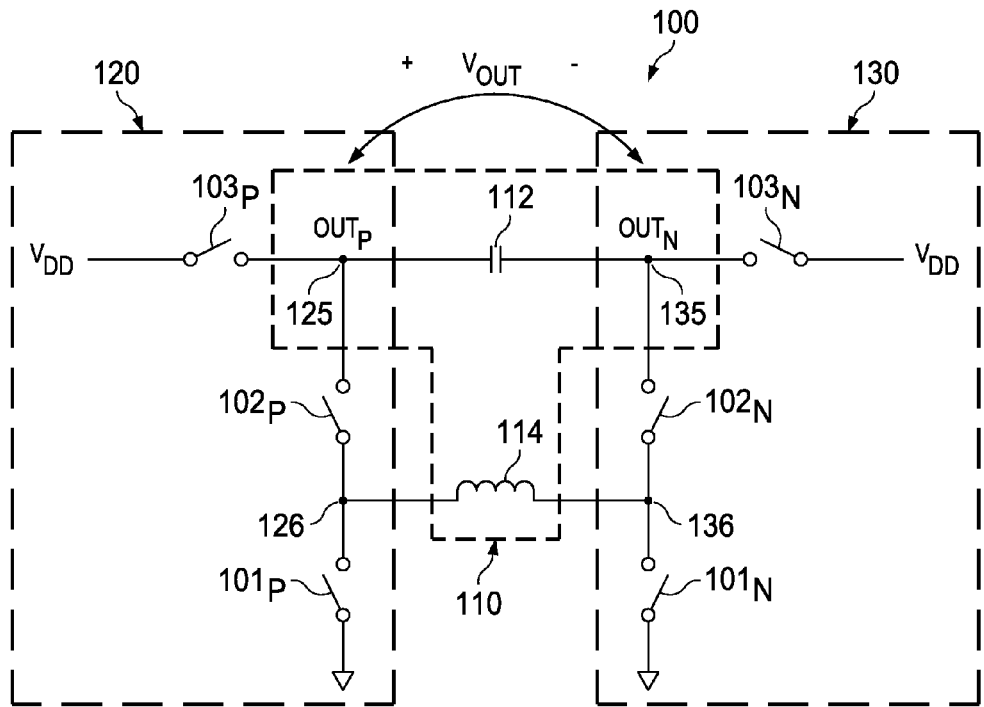
FIG. 1 is a simplified circuit diagram of the switching portion of a differential output driver circuit.

FIG. 1 is a simplified schematic of a full bridge driver circuit 100. The circuit 100 is generally symmetrical, with a differential output section 110 in the middle, a first half-bridge section 120 on the left side for handling positive signals, and a second half-bridge section 130 on the right side for handling negative signals.

The differential output section 110 includes a capacitor 112 coupled between node 125 and node 135 that represents the output load, and an inductor 114 coupled between node 126 and node 136 that provides current to the load under appropriate conditions. Node 125 has the designation $OUT_P$ as it represents the positive side of the differential output voltage $V_{OUT}$. Node 135 has the designation $OUT_N$ as it represents the negative side of the differential output voltage $V_{OUT}$. Node 126 has the designation $SW_P$ as it represents the positive terminal side of the inductor 114. Node 136 has the designation $SW_N$ as it represents the negative terminal side of the inductor 114.

The first half-bridge section 120 of the circuit 100 includes switches $101_P$, $102_P$ and $103_P$, while the second side half-bridge section 130 of the circuit includes corresponding switches $101_N$, $102_N$ and $103_N$. Control signals for the switches are not presented in the simplified circuit of FIG. 1, but are described in relation to FIG. 2 below. Switch $103_P$ is coupled between the supply voltage $V_{DD}$ and the first output node 125. Switch $102_P$ is coupled between the first output node 125 and the first switching node 126. Switch $101_P$ is coupled between the first switching node 126 and ground. Likewise, switch $103_N$ is coupled between the supply voltage $V_{DD}$ and the second output node 135. Switch $102_N$ is coupled between the second output node 135 and the second switching node 136. Switch $101_N$ is coupled between the second switching node 136 and ground.

As noted above, switches $103_P$ and $103_N$ are used to connect the output nodes 125 and 135, respectively, to the supply voltage $V_{DD}$. However, to avoid shorting the output when the sign changes, controls will be implemented so that only one of the switches $103_P$ and $103_N$ will be closed or enabled at any point in time. For positive signals, switch $103_N$ holds the output $OUT_N$ at the second output node 135 to $V_{DD}$ while the positive half-bridge 120 boosts the output $OUT_P$ at the first output node 125 above $V_{DD}$. For negative signals, switch $103_P$ holds the output $OUT_P$ at the first output node 125 to $V_{DD}$ while the negative half-bridge 130 boosts the output $OUT_N$ at the second output node 135 above $V_{DD}$.

Switches $101_P$, $101_N$, $102_P$ and $102_N$ control the charging and discharging of the inductor 114, but are operated and controlled independently of the operation of switches $103_P$ and $103_N$. In one cycle, switches $103_N$, $102_N$ and $101_P$ are open and switches $103_P$, $102_P$ and $101_N$ are closed. This shorts the positive side of the inductor 114 to ground, thereby developing a positive voltage across the inductor 114, while the current across the inductor ramps up. However, the resulting differential output $OUT_P$–$OUT_N$ is negative.

In another cycle, switches $103_P$, $102_N$ and $101_P$ are open and switches $103_N$, $102_P$ and $101_N$ are closed. This again shorts the positive side of the inductor 114 to ground, thereby developing a positive voltage across the inductor 114, while the current across the inductor ramps up. In this case, however, the resulting differential output $OUT_P$–$OUT_N$ is positive.

In yet another cycle, switches $103_N$, $102_P$ and $101_N$ are open and switches $103_P$, $102_N$ and $101_P$ are closed. This shorts the negative side of the inductor 114 to ground, thereby developing a negative voltage across the inductor 114, while the current across the inductor ramps down. In this case, the resulting differential output $OUT_P$–$OUT_N$ is negative.

Finally, in a fourth cycle, switches $103_P$, $102_P$ and $101_N$ are open and switches $103_N$, $102_N$ and $101_P$ are closed. This again shorts the negative side of the inductor 114 to ground, thereby developing a negative voltage across the inductor 114, while the current across the inductor ramps down. The resulting differential output $OUT_P$–$OUT_N$ in this cycle is positive.

Figure 2:
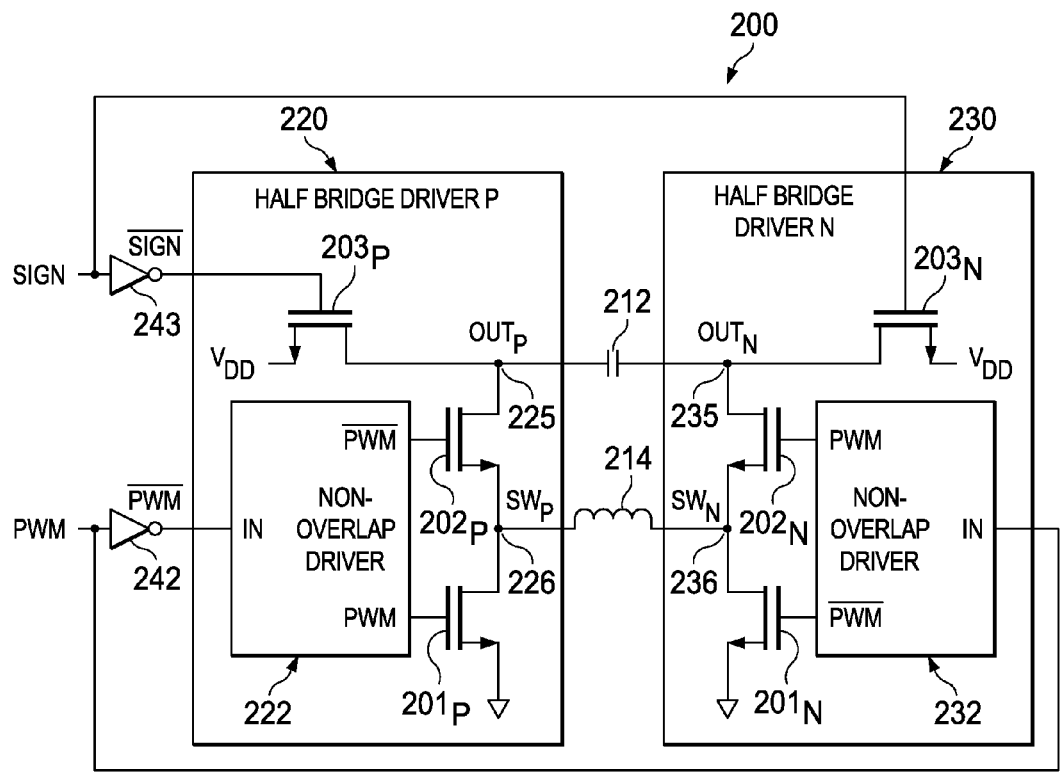
FIG. 2 is a circuit diagram illustrating one embodiment of a differential output driver circuit incorporating the switching portion of FIG. 1.

FIG. 2 is a schematic of one embodiment of an output driver circuit 200 that incorporates the full bridge driver circuit 100 illustrated in FIG. 1. Control signals SIGN and PWM (and their complements $\overline{SIGN}$ and $\overline{PWM}$) are used to control the operating states of the circuit 200 in order to generate a differential output signal $V_{OUT}$ which is equal to the difference between the positive output voltage $OUT_P$ at the positive output node 225 and the negative output voltage $OUT_N$ at the negative output node 235. Each of the differential output signals $OUT_P$, $OUT_N$ is alternately clamped to $V_{DD}$ or boosted above $V_{DD}$ as a half-wave rectified signal according to a control scheme.

The output stage of circuit 200 includes a capacitive load 212 coupled between the positive output node 225 ($OUT_P$) and the negative output node 235 ($OUT_N$), and an inductor 214 coupled between the positive switching node 226 ($SW_P$) and the negative switching node 236 ($SW_N$).

The positive side half-bridge section 220 of the circuit 200 includes switches $201_P$, $202_P$ and $203_P$, while the negative side half-bridge section 230 of the circuit includes corresponding switches $201_N$, $202_N$ and $203_N$. In an embodiment, all of the switches shown in FIG. 2 are implemented using field effect power transistors.

On the positive half-bridge side 220, switch $203_P$ has its channel coupled between the supply voltage $V_{DD}$ and the positive output node 225. The gate of switch $203_P$ is coupled to the inverted output of buffer 243, which provides the complementary signal $\overline{SIGN}$ of the control signal SIGN to the gate. Thus, when the control signal SIGN is low (and therefore signal $\overline{SIGN}$ is high), the switch $203_P$ is on and the channel conducts the supply voltage $V_{DD}$ to the positive output node 225. When the control signal SIGN is high (and therefore signal $\overline{SIGN}$ is low), the switch $203_P$ is off and the channel does not conduct.

Switch $202_P$ has its channel coupled between the positive output node 225 and the positive switching node 226. The gate of switch $202_P$ is coupled to a first output of a non-overlapping driver circuit 222 to receive the inverted control signal $\overline{PWM}$. Switch $201_P$ has its channel coupled between the switching node 226 and ground. The gate of switch $201_P$ is coupled to a second output of the non-overlapping driver circuit 222 to receive the non-inverted control signal PWM The non-overlapping driver circuit 222 has an input terminal coupled to the inverted output of buffer 242, which provides the complement signal $\overline{PWM}$ of the control signal PWM to the input terminal. The non-overlapping driver circuit 222 thus generates complementary outputs $\overline{PWM}$ and PWM such that the on-state of switches $202_P$ and $201_P$ will be mutually exclusive.

On the negative half-bridge side 230, switch $203_N$ has its channel coupled between the supply voltage $V_{DD}$ and the negative output node 235. The gate of switch $203_N$ is coupled to the control signal SIGN. Thus, when the control signal SIGN is high, the switch $203_N$ is on and the channel conducts the supply voltage $V_{DD}$ to the negative output node 235. When the control signal SIGN is low, the switch $203_N$ is off and the channel does not conduct.

Switch $202_N$ has its channel coupled between the negative output node 235 and the negative switching node 236. The gate of switch $202_N$ is coupled to a first output of a non-overlapping driver circuit 232 to receive the control signal PWM. Switch $201_N$ has its channel coupled between the negative switching node 236 and ground. The gate of switch $201_N$ is coupled to a second output of the non-overlapping driver circuit 232 to receive the complementary control signal $\overline{PWM}$.

The non-overlapping driver circuit 232 has an input terminal coupled to the control signal PWM to generate complementary outputs PWM and $\overline{PWM}$ to switches $202_N$ and $201_N$, respectively, such that the on-state of switches $202_N$ and $201_N$ will be mutually exclusive. This avoids shoot-through current from either of the output nodes to ground. Likewise, although not shown in FIG. 2, a non-overlapping driver circuit is also incorporated for each of switches $203_P$ and $203_N$ such that the on-state of these switches is also mutually exclusive. This avoids shorting the output when the SIGN signal changes.

Thus, the inductor has two normal connection states, namely, connected between the positive output node 225 and ground, or between the negative output node 235 and ground. Since one or the other output node is held at the supply voltage $V_{DD}$, the magnitude of voltage across the inductor is either $V_{DD}$ or higher. The sign of voltage across the inductor is defined as positive when switches $202p$ and $201n$ are on and negative when switches $202n$ and $201p$ are on.

A third inductor state is also provided where the non-overlapping drivers 222, 232 are bypassed to drive the switching nodes 226, 236 to ground simultaneously. This state is used to null the inductor current back to zero, either for a shut down sequence or a sign change. For example, during a shut down event, there is current in the inductor that must drop to zero. Likewise, during a sign change event, i.e., a change in the control signal SIGN, the output nodes are momentarily disconnected from the supply voltage $V_{DD}$. The third state allows the inductor to be temporarily and briefly nulled to ground to avoid spikes on the switching nodes while the load is disconnected.

Figure 3:
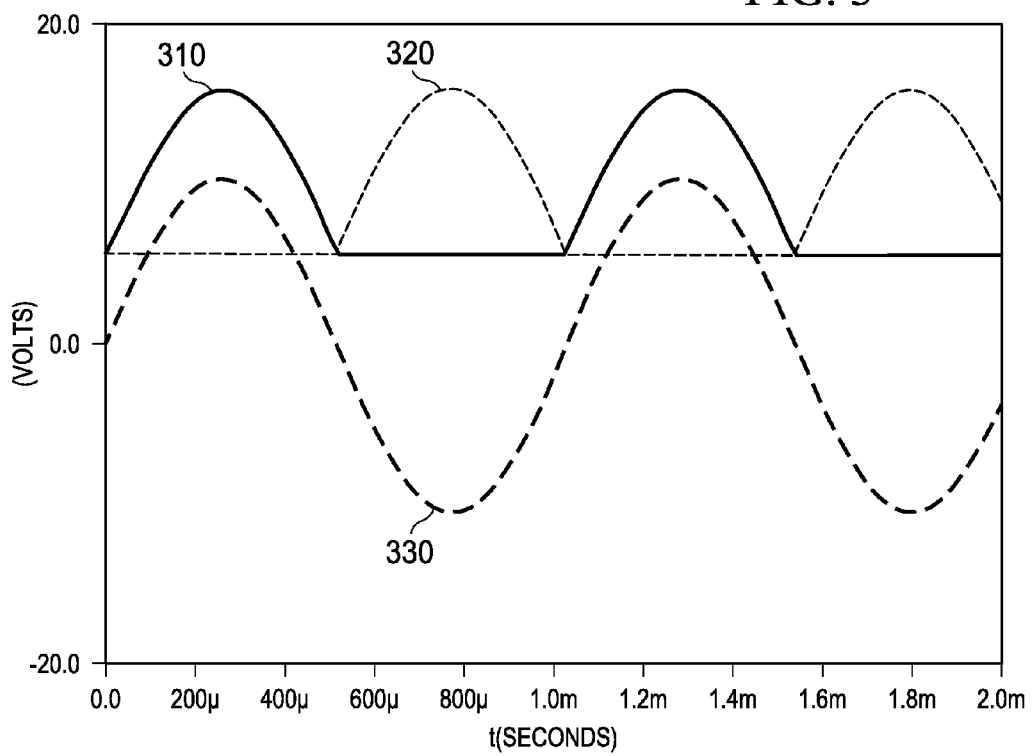
FIG. 3 is a graph of voltage versus time at the output nodes of the differential output driver circuit of FIG. 2.

FIG. 3 shows the results of a simulation for normal operation of the driver circuit 200 at the output nodes. Waveform 310 is a single-ended output at positive output node 225 that exhibits half-wave rectification, while waveform 320 is a single-ended output at negative output node 235 that also exhibits half-wave rectification. Thus, when circuit 200 clamps the negative output node 235 to the supply voltage $V_{DD}$, the half-bridge driver 220 boosts the voltage output $OUT_P$ at positive output node 225 above the supply voltage $V_{DD}$. Likewise, when circuit 200 clamps the positive output node 225 to the supply voltage $V_{DD}$, the half-bridge driver 230 boosts the voltage output $OUT_N$ at negative output node 235 above the supply voltage $V_{DD}$. The differential signal $OUT_N$–$OUT_P$ is represented by waveform 330 and is a sine wave that varies in this example between +10V and −10V. Thus, the circuit 200 controls the voltage at nodes 225, 235 such that the minimum voltage for charging and discharging the inductor 214 is $V_{DD}$.

Figure 4:
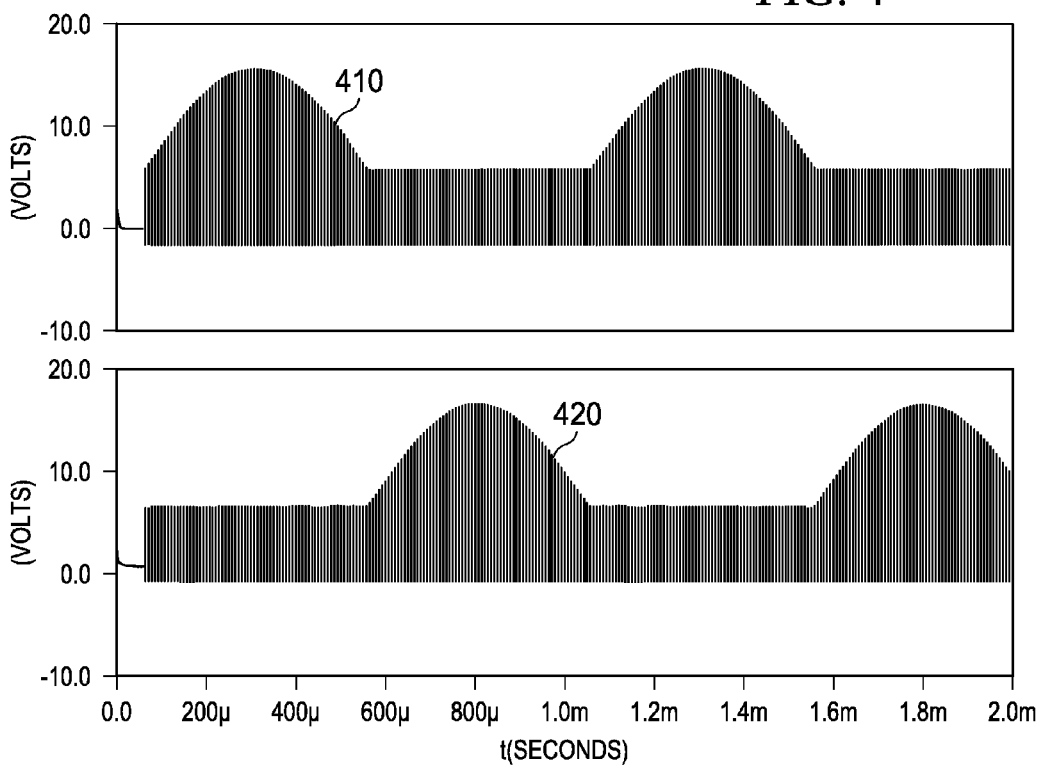
FIG. 4 is a graph of voltage versus time at the switching nodes of the differential output driver circuit of FIG. 2.

FIG. 4 shows the results of a simulation for normal operation of the driver circuit 200 at the switching nodes. Waveform 410 illustrates the voltage at the positive switching node 226 while waveform 420 illustrates the voltage at the negative switching node 236. As is apparent from the figure, each of the switching nodes toggles between ground and the output voltage at the respective output node at a very high frequency, for example 1.2 MHz, and each switching node follows its respective output node. The fact that the voltages at the output nodes are half-wave rectified is also reflected at the respective switching nodes.

Figure 5:
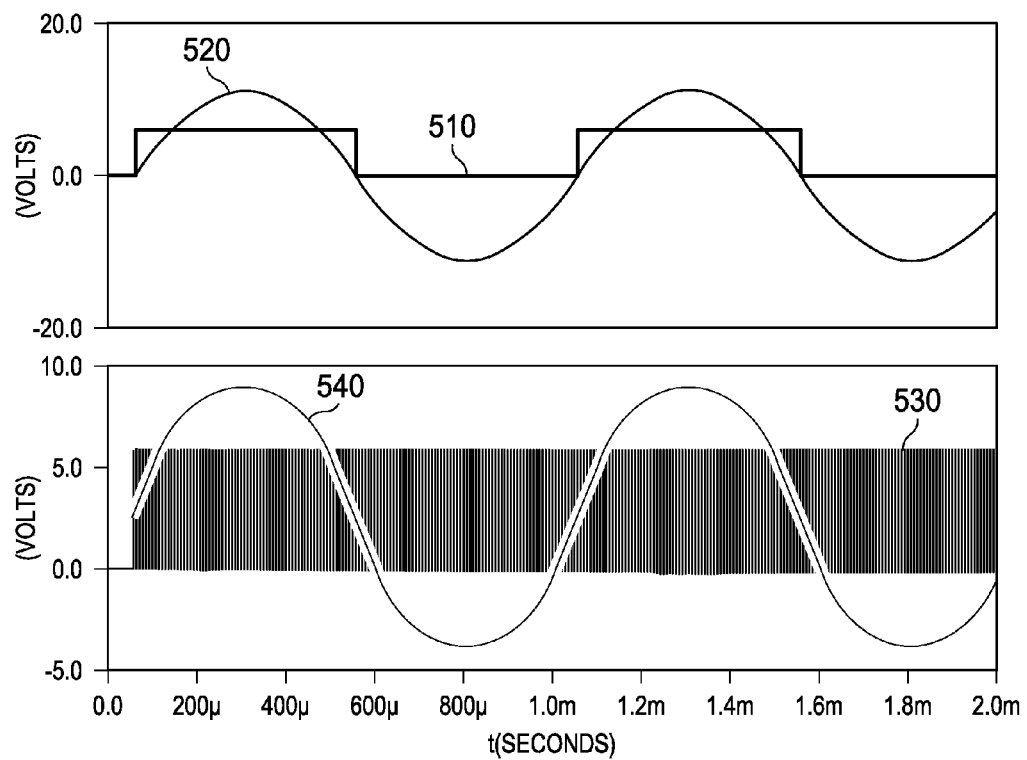
FIG. 5 is a graph of voltage versus time for control signals applied to the differential output driver circuit of FIG. 2.

FIG. 5 shows an example representation of the control signals PWM and SIGN for normal operation of the driver circuit 200. Waveform 510 represents the SIGN control signal, which is a digital signal that has a value of logical 1 for a positive driven output and a value of logical 0 for a negative driven output. Waveform 520 represents the differential output signal $OUT_P$–$OUT_N$, which varies between −10V and +10V and has a sign that follows the control signal SIGN. The alignment of the SIGN signal with the zero crossing of the differential output signal point is flexible and need not be exact. Timing offsets from the edge of the SIGN signal should be subtracted from the minimum inductor voltage $V_{DD}$.

Waveform 530 represents the control signal PWM, which varies between 0V and 5V at a high frequency, e.g. 1.2 MHz. Waveform 540 represents the duty cycle for the signal PWM, which controls the differential output voltage. A 50% duty cycle corresponds to zero voltage output, while a duty cycle greater than 50% generates a positive driven signal and a duty cycle less than 50% generates a negative driven signal.

Figure 6A:
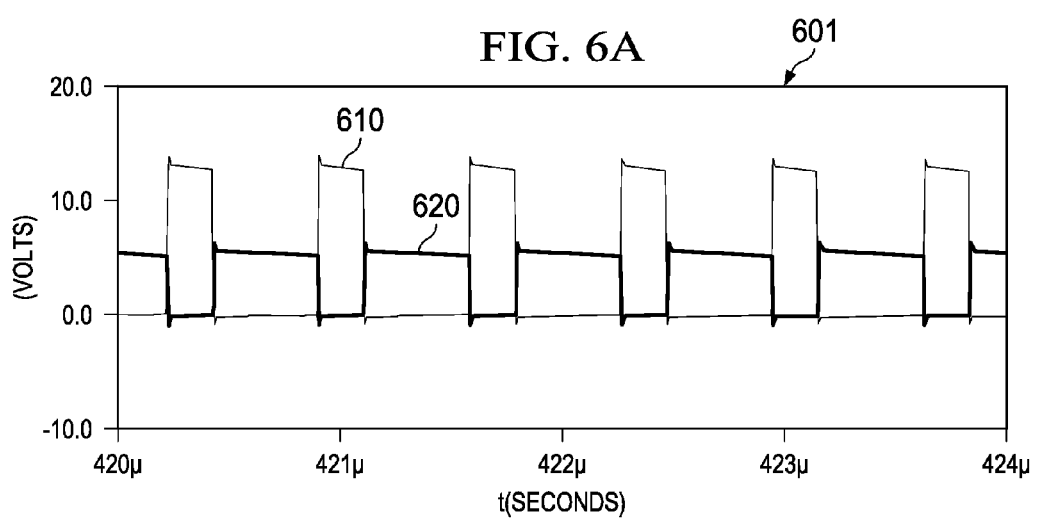
FIG. 6A is a graph of voltage versus time at the switching nodes of the differential output driver circuit of FIG. 2 with an increased magnification relative to FIG. 4.

FIG. 6A shows an example representation 601 of how the control signal PWM controls the state of the switching nodes 226, 236 in driver circuit 200. In graph 601, waveform 610 represents the voltage $V_{SWP}$ at switching node 226, while waveform 620 represents the voltage $V_{SWN}$ at switching node 236. Graph 601 presents the waveforms 610, 620 at a significantly greater magnification (1 µs per horizontal division) than the waveforms 410, 420 shown in FIG. 4 (200 µs per horizontal division). Thus, the positive switching node 226 toggles between ground and $V_{DD}+V_{OUT}$, while the negative switching node 236 toggles between ground and $V_{DD}$.

Figure 6B:
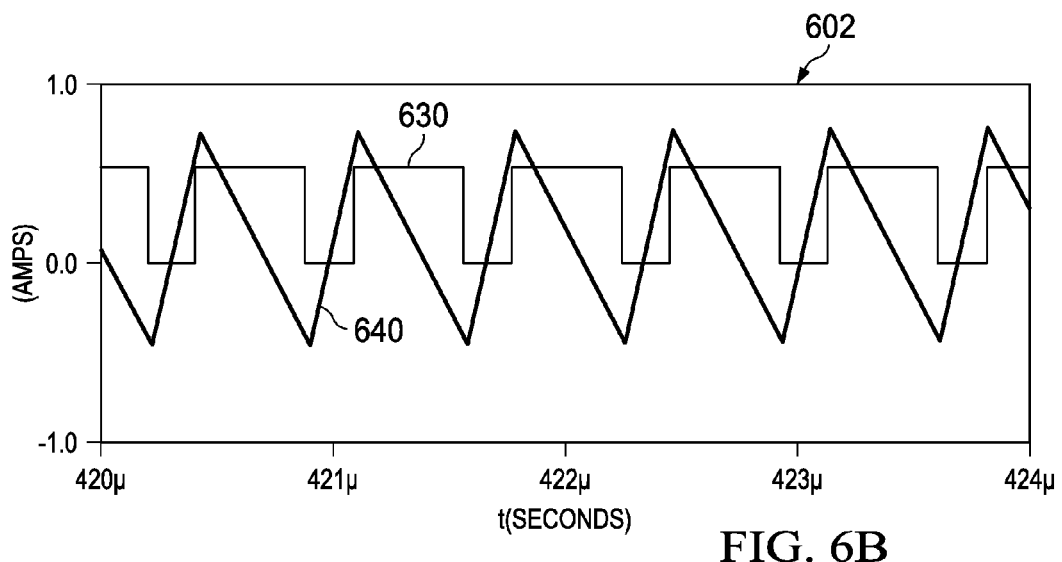
FIG. 6B is a graph of voltage versus time at the switching nodes of the differential output driver circuit of FIG. 2 with an increased magnification relative to FIG. 4.

In FIG. 6B, graph 602 shows waveform 630, which represents the PWM control signal, while waveform 640 represents the inductor current. Graph 602 presents waveform 630 at a greater magnification (1 µs per horizontal division) than the waveform 530 shown in FIG. 5 (200 µs per horizontal division). The control signal PWM toggles between ground and $V_{DD}$. The differential voltage across the inductor is $V_{SWP}-V_{SWN}$. When the differential voltage across the inductor is positive, then a positive current will be developed across the inductor. When the differential voltage across the inductor is negative, then a negative current will be developed across the inductor.

Figure 7:
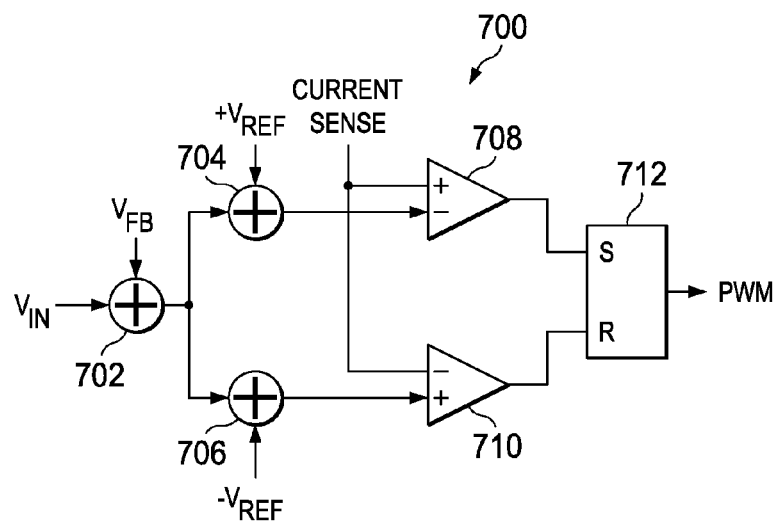
FIG. 7 is a simplified block diagram illustrating one embodiment for generating the control signal PWM.

FIG. 7 is a simplified block diagram of one circuit embodiment 700 for generating the control signal PWM. A voltage input signal $V_{IN}$ is combined with a voltage feedback signal $V_{FB}$ by summing circuit 702, where $V_{FB}$ is equivalent to the differential voltage $V_{OUT}$ in FIG. 1. The output of summing circuit 702 is provided to summing circuits 704 and 706. Summing circuit 704 combines the output of summing circuit 702 with a positive voltage reference $+V_{REF}$, while summing circuit 706 combines the output of summing circuit 702 with a negative voltage reference $-V_{REF}$.

The output of summing circuit 704 is coupled to the inverting input of comparator 708. Likewise, the output of summing circuit 706 is coupled to the inverting input of comparator 710. A current sense signal, namely a voltage representation of the current at the inductor, is provided to the non-inverting inputs of both amplifiers 708 and 710. The output of comparator 708 is coupled to the S (set) input of RS latch 712, while the output of comparator 710 is coupled to the R (reset) input of RS latch 712. The output of the RS latch 712 is the control signal PWM.

Although illustrative embodiments have been shown and described by way of example, a wide range of alternative embodiments is possible within the scope of the foregoing disclosure.

The invention claimed is:

1. A switching circuit for a differential output driver for a capacitive load, comprising:
   a first half bridge circuit having a first output node and a first switching node;
   a second half bridge circuit having a second output node and a second switching node, the capacitive load being coupled between the first output node and the second output node;
   an inductor coupled between the first switching node and the second switching node;
   a control circuit coupled to the first half bridge circuit and to the second half bridge circuit, the control circuit configured to operate the switching circuit with a first control signal and a second control signal, the first control signal having two states including a first state that enables coupling the first output to a supply voltage and a second state that enables coupling the second output to the supply voltage, the second control signal having two states including a first state that enables coupling the first switching node to ground and enables coupling the second switching node to the second output, and a second state that enables coupling the second switching node to ground and enables coupling the first switching node to the first output.

2. The switching circuit of claim 1, further comprising:
a first switch coupled between the first output node and the supply voltage, the first switch is open for positive driven signals and the first switch is closed for negative driven signals; and
a second switch coupled between the second output node and the supply voltage, the second switch is closed for positive driven signals and the second switch is open for negative driven signals.

3. The switching circuit of claim 2, further comprising:
the operation of the first switch and the second switch is mutually exclusive.

4. The switching circuit of claim 2, further comprising:
a third switch and a fourth switch coupled in series between the first output node and ground, the first switching node is located at the interconnection of the third and fourth switches; and
a fifth switch and a sixth switch coupled in series between the second output node and ground, the second switching node is located at the interconnection of the fifth and sixth switches;
wherein a first control mode of the switching circuit enables the first state of the first control signal and the first state of the second control signal, such that the first switch is closed, the second switch is open, the third switch is closed, the fourth switch is open, the fifth switch is open, and the sixth switch is closed;
wherein a second control mode of the switching circuit enables the first state of the first control signal and the second state of the second control signal, such that the first switch is closed, the second switch is open, the third switch is open, the fourth switch is closed, the fifth switch is closed, and the sixth switch is open;
wherein a third control mode of the switching circuit enables the second state of the first control signal and the first state of the second control signal, such that the first switch is open, the second switch is closed, the third switch is closed, the fourth switch is open, the fifth switch is open, and the sixth switch is closed; and
wherein a fourth control mode of the switching circuit enables the second state of the first control signal and the second state of the second control signal, such that the first switch is open, the second switch is closed, the third switch is open, the fourth switch is closed, the fifth switch is closed, and the sixth switch is open.

5. The switching circuit of claim 4, further comprising:
a non-overlapping driver coupled to the first switch and to the second switch and configured for mutually exclusive operation of the first switch and the second switch.

6. The switching circuit of claim 3, further comprising:
the operation of the third and fourth switches is mutually exclusive, and the operation of the fifth and sixth switches is mutually exclusive, wherein the third and sixth switches operate together and the fourth and fifth switches operate together.

7. The switching circuit of claim 6, further comprising:
a first non-overlapping driver coupled to the third and fourth switches; and
a second non-overlapping driver coupled to the fifth and sixth switches.

8. The switching circuit of claim 3, further comprising each of the switches is a power field effect transistor.

9. A switching circuit for a differential output driver for a capacitive load, comprising:
a first switch coupled between a first output node and a supply voltage;
a second switch coupled between a second output node and the supply voltage, the capacitive load being coupled between the first output node and the second output node;
a third switch coupled between the first output node and a first switching node;
a fourth switch coupled between the first switching node and ground;
a fifth switch coupled between the second output node and a second switching node;
a sixth switch coupled between the second switching node and ground;
an inductor coupled between the first switching node and the second switching node;
a first control circuit for generating a first control signal, the first control signal having two states including a first state that enables coupling the first output node to the supply voltage and a second state that enables coupling the second output node to the supply voltage; and
a second control circuit for generating a second control signal, the second control signal having two states including a first state that enables coupling the first switching node to ground and enables coupling the second switching node to the second output, and a second state that enables coupling the second switching node to ground and enables coupling the first switching node to the first output.

10. The switching circuit of claim 9, further comprising:
the switching circuit operating in a first control mode that enables the first state of the first control signal and the first state of the second control signal, such that the first switch is closed, the second switch is open, the third switch is closed, the fourth switch is open, the fifth switch is open, and the sixth switch is closed;
the switching circuit operating in a second control mode that enables the first state of the first control signal and the second state of the second control signal, such that the first switch is closed, the second switch is open, the third switch is open, the fourth switch is closed, the fifth switch is closed, and the sixth switch is open;
the switching circuit operating in a third control mode that enables the second state of the first control signal and the first state of the second control signal, such that the first switch is open, the second switch is closed, the third switch is closed, the fourth switch is open, the fifth switch is open, and the sixth switch is closed; and
the switching circuit operating in a fourth control mode that enables the second state of the first control signal and the second state of the second control signal, such that the first switch is open, the second switch is closed, the third switch is open, the fourth switch is closed, the fifth switch is closed, and the sixth switch is open.

11. The switching circuit of claim 9, wherein the operation of the first and second switches is mutually exclusive.

12. The switching circuit of claim 11, further comprising:
a non-overlapping driver coupled to the first switch and to the second switch and configured for mutually exclusive operation of the first switch and the second switch.

13. The switching circuit of claim 11, further comprising:
a first non-overlapping driver coupled to the third and fourth switches; and
a second non-overlapping driver coupled to the fifth and sixth switches.

14. A method for generating a differential output voltage for a capacitive load, comprising:
operating a switching circuit in a plurality of control modes, the switching circuit comprising a first half bridge circuit having a first output node and a first switching node and a second half bridge circuit having a second output node and a second switching node, with the capacitive load coupled between the first output node and the second output node, and an inductor coupled between the first switching node and the second switching node,
wherein a first control mode couples the first output node to a supply voltage and the first switching node to ground, a second control mode couples the first output node to the supply voltage and the second switching node to ground, a third control mode couples the second output node to the supply voltage and the first switching node to ground, and a fourth control mode couples the second output node to the supply voltage and the second switching node to ground.

15. The method of claim 14, further comprising:
providing a first switch coupled between the first output node and the supply voltage, the first switch being open for positive driven signals and the first switch being closed for negative driven signals; and
providing a second switch coupled between the second output node and the supply voltage, the second switch being closed for positive driven signals and the first switch being open for negative driven signals.

16. The method of claim 15, wherein the operation of the first switch and the second switch is mutually exclusive.

17. The method of claim 15, further comprising:
providing a third switch and a fourth switch coupled in series between the first output node and ground, the first switching node is located at the interconnection of the third and fourth switches;
providing a fifth switch and a sixth switch coupled in series between the second output node and ground, the second switching node is located at the interconnection of the fifth and sixth switches;
generating a first control signal and a second control signal for controlling the switching circuit, the first control signal having two states including a first state that enables coupling the first output node to the supply voltage and a second state that enables coupling the second output to the supply voltage, the second control signal having two states including a first state that enables coupling the first switching node to ground and enables coupling the second switching node to the second output, and a second state that enables coupling the second switching node to ground and enables coupling the first switching node to the first output;
wherein the first control mode of the switching circuit enables the first state of the first control signal and the first state of the second control signal, such that the first switch is closed, the second switch is open, the third switch is closed, the fourth switch is open, the fifth switch is open, and the sixth switch is closed;

wherein the second control mode of the switching circuit enables the first state of the first control signal and the second state of the second control signal, such that the first switch is closed, the second switch is open, the third switch is open, the fourth switch is closed, the fifth switch is closed, and the sixth switch is open;

wherein the third control mode of the switching circuit enables the second state of the first control signal and the first state of the second control signal, such that the first switch is open, the second switch is closed, the third switch is closed, the fourth switch is open, the fifth switch is open, and the sixth switch is closed; and wherein the fourth control mode of the switching circuit enables the second state of the first control signal and the second state of the second control signal, such that the first switch is open, the second switch is closed, the third switch is open, the fourth switch is closed, the fifth switch is closed, and the sixth switch is open.

* * * * *